(12) United States Patent
Lung et al.

(10) Patent No.: US 8,406,033 B2
(45) Date of Patent: Mar. 26, 2013

(54) MEMORY DEVICE AND METHOD FOR SENSING AND FIXING MARGIN CELLS

(75) Inventors: Hsiang-Lan Lung, Elmsford, NY (US); Yen-Hao Shih, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 529 days.

(21) Appl. No.: 12/488,995

(22) Filed: Jun. 22, 2009

(65) Prior Publication Data

US 2010/0321987 A1 Dec. 23, 2010

(51) Int. Cl.
*G11C 11/00* (2006.01)
(52) U.S. Cl. .......................... 365/148; 365/222; 365/236
(58) Field of Classification Search .................. 365/148, 365/158, 163, 171, 173, 222
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |

(Continued)

FOREIGN PATENT DOCUMENTS

WO 2004025659 A1 3/2004

OTHER PUBLICATIONS

Wolf, Stanley, Excerpt from: Silicon Processing for the VLSI Era—vol. 4, pp. 674-679, 2004.

(Continued)

*Primary Examiner* — Tuan T Nguyen
*Assistant Examiner* — Lance Reidlinger
(74) *Attorney, Agent, or Firm* — Haynes Beffel & Wolfeld LLP (57) ABSTRACT

A programmable resistance memory device with a margin cell detection and refresh resources. Margin cell detection and refresh can include reading a selected cell, measuring a time interval which correlates with resistance of the selected cell during said reading, and enabling a refresh process if the measured time falls within a pre-specified range. The refresh process includes determining a data value stored in the selected cell, using for example a destructive read process, and refreshing the data value in the selected cell. The time interval can be measured by detecting timing within the sensing interval of a transition of voltage or current on a bit line across a threshold.

12 Claims, 8 Drawing Sheets

U.S. PATENT DOCUMENTS

| | | | |
|---|---|---|---|
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,075,719 A | 6/2000 | Lowrey et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,188,615 B1 * | 2/2001 | Perner et al. | 365/158 |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,438,035 B2 | 8/2002 | Yamamoto et al. | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,512,263 B1 | 1/2003 | Yuan et al. | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,584,017 B2 | 6/2003 | Maayan et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,762,952 B2 * | 7/2004 | Munden et al. | 365/158 |
| 6,768,665 B2 * | 7/2004 | Parkinson et al. | 365/113 |
| 6,781,906 B2 * | 8/2004 | Perner et al. | 365/209 |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 6,998,289 B2 | 2/2006 | Hudgens et al. | |
| 7,023,008 B1 | 4/2006 | Happ | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,085,154 B2 | 8/2006 | Cho et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,126,847 B2 | 10/2006 | Ha et al. | |
| 7,132,675 B2 | 11/2006 | Gilton | |
| 7,151,273 B2 | 12/2006 | Campbell et al. | |
| 7,154,774 B2 | 12/2006 | Bedeschi et al. | |
| 7,158,411 B2 | 1/2007 | Yeh et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,190,607 B2 | 3/2007 | Cho et al. | |
| 7,202,493 B2 | 4/2007 | Lung et al. | |

| | | |
|---|---|---|
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,242,618 B2 | 7/2007 | Shappir et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,505,330 B2 | 3/2009 | Pawlowski et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,764,533 B2 * | 7/2010 | Breitwisch et al. ........... 365/148 |
| 7,830,701 B2 * | 11/2010 | Siau et al. .................... 365/148 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0158948 A1 | 7/2006 | Fuji |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |

| | | |
|---|---|---|
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0002464 A1 | 1/2008 | Maayan |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0273968 A1 | 11/2009 | Lamorey et al. |
| 2009/0289242 A1 | 11/2009 | Breitwisch et al. |
| 2009/0294748 A1 | 12/2009 | Breitwisch et al. |
| 2010/0214829 A1* | 8/2010 | Breitwisch et al. ........... 365/163 |

OTHER PUBLICATIONS

Wuttig, Matthias, "Towards a Universal Memory?" Nature Materials, Apr. 2005, pp. 265-266, vol. 4.
Yamada, Noboru, "Potential of Ge-Sb-Te phase-change optical disks for high-data-rate recording in the near future," (Conference Proceedings Paper), Jul. 30, 1997, vol. 3109, 10 pages.
Yi, J. H. et al., "Novel Cell Structure of PRAM with Thin Metal Layer Inserted GeSbTe," IEEE IEDM Dec. 10, 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
"Magnetic Bit Boost," www.sciencenews.org, Dec. 18 & 25, 2004, p. 389, vol. 166.
"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Intl Symp on VLSI Technology, Systems and Applications, Apr. 23-25, 2007, pp. 1-2.
Chen, AN et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb, "Jun. 14-16, 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

* cited by examiner

MEMORY DEVICE AND METHOD FOR SENSING AND FIXING MARGIN CELLS

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to programmable resistance memory devices, including phase change memory devices, and to refresh techniques associated with maintaining data values stored in such devices.

2. Description of Related Art

Phase change based memory materials, like chalcogenide based materials and similar materials, can be caused to change phase in active regions of a memory element between an amorphous phase and a crystalline phase by application of electrical current at levels suitable for implementation in integrated circuits. The amorphous phase is characterized by higher electrical resistivity than the crystalline phase, and the difference in resistance can be readily sensed to indicate data.

In order to achieve high density memory, smaller memory cell structures are needed. However, attempts to reduce the size of the phase change material element and/or the electrodes can result in data retention issues. For example, in a memory cell programmed to a high resistance state having amorphous phase material in an active region of the memory element, environmental conditions can result in drift in the resistance due to re-crystallization of small portions of the active region. When the resistance drifts out of the sensing margin specified for the programmed data value, then the data is lost. Similar issues can arise in other types of programmable resistance memory materials.

Thus, methods to improve data retention for phase change memory devices based on refresh operations like those encountered in dynamic random access memory have been investigated. See, United States Patent Application Publication No. US 2006/0158948 A1, by Fuji.

However, the need remains for efficient technologies to detect cells that need refresh (called margin cells herein), and to refresh such cells with correct data values.

SUMMARY

A method for operating a memory device with a margin cell detection and refresh process, where the memory device includes an array of programmable resistance memory cells such as cells having phase change memory elements, and a set of sense amplifiers coupled to the array which sense changes of voltage or current on bit lines coupled to selected memory cells. The method for margin cell detection and refresh comprises reading a selected cell, measuring a time interval which correlates with resistance of the selected cell during said reading, and enabling a refresh process if the measured time falls within a pre-specified range. The refresh process includes determining a data value stored in the selected cell, and refreshing the data value in the selected cell. The time interval can be measured by detecting timing within a sensing interval with which the sense amplifier operates, of a transition of voltage or current on a bit line across a threshold.

The data value stored in the selected cell can be determined by storing a first parameter indicating length of the measured time interval for the selected cell, writing a reference data value to the selected cell, measuring a second time interval which correlates with resistance of the selected cell after writing the reference data value, storing a second parameter indicating length of the second time interval, and comparing the first parameter to the second parameter.

In embodiments in which the programmable resistance memory cells include phase change memory elements, having a set state corresponding to a first data value and a reset state corresponding to a second data value, the reference data value can be either the first data value or the second data value. In the case in which the first data value (set state) is used, then the process indicates the data value of the selected cell is the second data value (reset state) if the first parameter is greater than the second parameter by more than a predetermined amount, else the data value of the selected cell is the first data value. If the data value of the selected cell is indicated to be the second data value, then a process is executed to write the second data value to the selected cell. In the case in which the second data value (reset state) is used as said reference data value, then the process indicates the data value of the selected cell is the first data value (set state) if the first parameter is less than the second parameter by more than a predetermined amount. If the data value of the selected cell is indicated to be the first data value, then a process is executed to write the first data value to the selected cell.

In some embodiments, where the memory device includes logic which executes write processes for writing data values in the array, the write processes including a set process to store a first data value (set state) in a selected cell and a reset process to store a second data value (reset state) in a selected cell. The set and reset processes for normal write operations are characterized by a set biasing arrangement and a reset biasing arrangement. The refresh set process to refresh the first data value in a selected cell can include applying a refresh set biasing arrangement that is different than the set biasing arrangement applied in normal write mode. Likewise, the refresh reset process to refresh the second data value in a selected cell can include applying a refresh reset biasing arrangement that is different than the reset biasing arrangement applied in normal write mode. Different biasing arrangements for refresh reset and set can be applied that have higher power, or longer pulses, in order to enable resetting or setting cells that are hard to program using normal write mode biasing arrangements.

In one embodiment described herein, a controller determines the data value stored in the selected cell by executing a process including storing an initial resistance of the margin cell, setting the selected cell to the set state, measuring a set state resistance, resetting the selected cell to the reset state, measuring a reset state resistance, and indicating that the data value of the selected cell is the first data value if the initial resistance is closer to the set state resistance than to the reset state resistance, else that the data value of the selected cell is the second data value. The set and reset steps can be executed in any order.

In addition, a memory device is disclosed including circuitry adapted to carry out the processes described above. The memory device includes an array of programmable resistance memory cells, a set of sense amplifiers coupled to the array which sense within sensing intervals changes of voltage or current on bit lines coupled to selected memory cells, timer circuitry coupled to the array which measures time intervals which correlate with resistance of a corresponding selected cell, logic responsive to the measured time for a selected cell to enable refresh logic if the measured time falls within a pre-specified range. As described above, the refresh logic includes logic to determine a data value stored in the selected cell, and to refresh the data value in the selected cell.

Other aspects and advantages of the present invention can be seen on review of the drawings, the detailed description and the claims, which follow.

DETAILED DESCRIPTION

A detailed description of embodiments of the present invention is provided with reference to the FIGS. 1-11.

Figure 1:
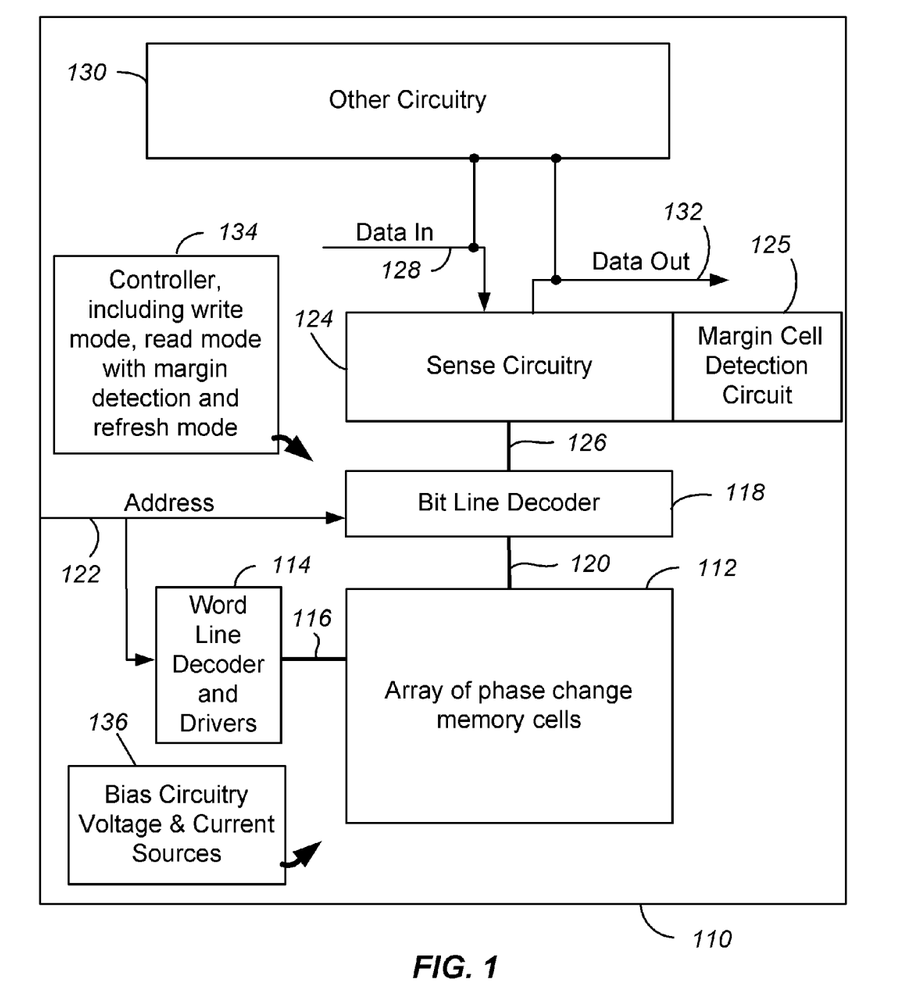
FIG. 1 is a simplified block diagram of an integrated circuit, programmable resistance memory device having logic to execute a margin cell detection and refresh process.

FIG. 1 is a simplified block diagram of an integrated circuit 110 including a memory array 112 implemented using programmable resistance memory cells, such as memory cells having phase change memory elements. A word line decoder 114 is coupled to and in electrical communication with a plurality of word lines 116 arranged along rows in the memory array 112. A bit line (column) decoder 118 is in electrical communication with a plurality of bit lines 120 arranged along columns in the array 112 for coupling selected memory cells in array 112 to sense amplifiers in sense circuitry 124. Addresses are supplied on bus 122 to word line decoder 114 and bit line decoder 118. Sense circuitry 124, including sense amplifiers and data-in structures, is coupled to bit line decoder 118 via data bus 126. Data is supplied via a data-in line 128 from input/output ports on integrated circuit 110, or from other data sources internal or external to integrated circuit 110, to data-in structures in sense circuitry 124. Other circuitry 130 may be included on integrated circuit 110, such as a general-purpose processor or special purpose application circuitry, or a combination of modules providing system-on-a-chip functionality supported by array 112. Data is supplied via a data-out line 132 from the sense amplifiers in circuitry 124 to input/output ports on integrated circuit 110, or to other data destinations internal or external to integrated circuit 110. Margin cell detection circuitry 125 is coupled with the sense circuitry 124 in this example.

A controller 134 is implemented in this example using a state machine to execute processes described below, and controls the bias circuitry voltage and current sources 136 for the application of bias arrangements for a read mode with margin detection, a write mode and a refresh write mode. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

The bias circuitry voltage and current sources in block 136 can be implemented using power supply inputs with voltage dividers and charge pumps, current source circuitry, pulse shaping circuitry, timing circuitry and voltage and current switches as are standard in the art.

In operation each of the memory cells in the array 112 stores data represented by the resistance of the corresponding memory element. The data value may be determined, for example, by comparison of voltage or current on a bit line for a selected memory cell to that of a suitable reference current or voltage by sense amplifiers in sense circuitry 124. The reference voltage or current can be established to between a predetermined range corresponding to a data value such as logical "0", and a different predetermined range corresponding to a data value such as logical "1".

Reading or writing to a memory cell of array 112, therefore, can be achieved by applying biasing arrangements including a suitable voltage to one of word lines and coupling one of bit lines to a voltage source so that current flows through the selected memory cell.

The write mode includes set and reset process for phase change memory. In biasing arrangements for a reset operation for a phase change memory cell, word line decoder 114 facilitates providing a word line with a suitable voltage pulse to turn on an access transistor of the memory cell. Bit line decoder 118 facilitates supplying a voltage pulse to a bit line of suitable amplitude and duration to induce a current to flow though the memory element, the current raising the temperature of the active region of the memory element above the transition temperature of the phase change material and also above the melting temperature to place the phase change material of the active region in a liquid state. The current is then terminated, for example, by terminating the voltage pulses on the bit line and on the word line, resulting in a relatively quick quenching time as the active region cools to a high resistance generally amorphous phase to establish a high resistance reset state in the memory cell. The reset operation can also comprise more than one pulse, for example using a pair of pulses.

In biasing arrangements for a set operation for a phase change memory cell, word line decoder 114 facilitates providing a word line with a suitable voltage pulse to turn on the access transistor of the memory cell. Bit line decoder 118 facilitates supplying a voltage pulse to a bit line of suitable amplitude and duration to induce a current to flow through the memory element, the current pulse sufficient to raise the temperature of the active region above the transition temperature and cause a transition in the active region from the high resistance generally amorphous phase into a low resistance generally crystalline phase, this transition lowering the resistance of all of the memory element and setting the memory cell to the low resistance state.

In a read mode for the memory cell, word line decoder 114 facilitates providing a word line with a suitable voltage pulse to turn on the access transistor of the memory cell. Bit line decoder 118 facilitates supplying a voltage to a bit line of suitable amplitude and duration to induce current to flow through the memory element that does not result in the memory element undergoing a change in resistive state. The current on the bit line and through the memory cell is dependent upon the resistance of, and therefore the data state associated with, the memory cell. Thus, the data state of the memory cell may be determined by detecting whether the resistance of the memory cell corresponds to the high resistance state or the low resistance state, for example by comparison of a voltage or a current on the corresponding bit line with a suitable reference voltage or current by sense amplifiers of sense circuitry 124. The margin cell detection circuitry 125 operates in coordination with the read mode in the examples described herein.

In a refresh mode, the control circuitry in controller 134 executes a procedure described in more detail below.

Figure 2:
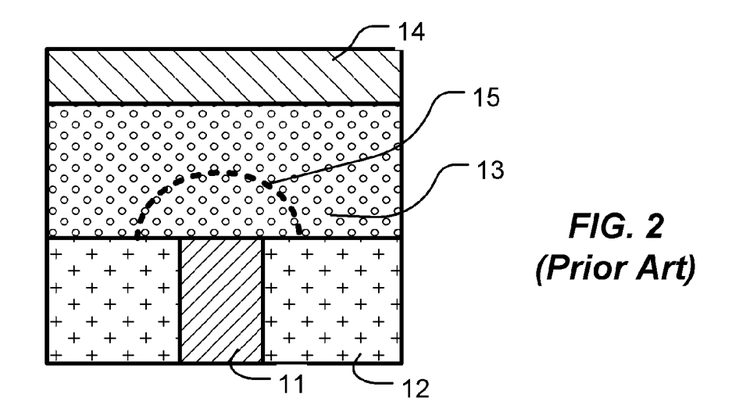
FIG. 2 is a simplified diagram of a prior art, programmable resistance memory cell, having a phase change memory element suitable for use in a device as shown in FIG. 1.

FIG. 2 illustrates a representative prior art programmable resistance memory cell having phase change memory element. The example structure shown in FIG. 2 is referred to as a "mushroom type" memory cell 10, having a first electrode 11 extending through dielectric 12, a memory element 13 comprising a body of phase change material, and a second electrode 14 on the memory element 13. The first electrode 11 is coupled to a terminal of an access device (not shown) such as a diode or transistor, while the second electrode 14 is coupled to a bit line and can be part of the bit line (not shown). The first electrode 11 has a width less than the width of the second electrode 14 and memory element 13, establishing a small contact area between the body of phase change material and the first electrode 11 and a relatively larger contact area between the body of phase change material and the second electrode 14, so that higher current densities are achieved with small absolute current values through the memory element 13. Because of this smaller contact area at the first electrode 11, the current density is largest in operation in the region adjacent the first electrode 11, resulting in the active region 15 having a "mushroom" shape as shown in the Figure. Other types of phase change memory elements, such as pore type elements, bridge type elements, in-via type elements and so on, can be utilized in devices described herein.

Memory cells having phase change memory elements can suffer drift in resistance, as the active region composition shifts from amorphous phase to crystalline phase, or vice versa, in small increments or in filaments through the active region, depending on environmental factors. The rate of the drift in resistance depends on a number of factors, including variations in structure across an array, manufacturing defects in the cells and environmental conditions to which the device is exposed.

The phase change material used in a representative embodiment can consist of silicon oxide doped $G_2S_2T_5$. Other phase change alloys including chalcogenides may be used as well. Chalcogens include any of the four elements oxygen (0), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a-b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference. Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800, 504, and U.S. Patent Application Publication No. US 2005/ 0029502.

Representative chalcogenide material can have a bulk stoichiometry characterized as follows: $Ge_xSb_yTe_z$, where x:y: z=2:2:5. Other compositions can be used with x: 0~5; y: 0~5; z: 0~10. GeSbTe with doping, such as N—, Si—, Ti—, or other element doping, may also be used. These materials can be formed by PVD sputtering or magnetron-sputtering with reactive gases of Ar, $N_2$, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. A post deposition annealing treatment with vacuum or $N_2$ ambient is sometimes needed to improve the crystallized state of chalcogenide material. The annealing temperature typically ranges 100° C. to 400° C. with an anneal time of less than 30 minutes.

The thickness of the chalcogenide material depends on the design of the cell structure. In general, a chalcogenide material with thickness of higher than 8 nm can have a phase change characterization such that the material exhibits at least two stable resistance states, although thinner layers may be suitable for some embodiments.

For memory cells implemented using GST or similar chalcogenides, suitable materials for implementing electrodes include TiN, TaN, W and doped Si. Alternatively, the electrodes are TiAlN or TaAlN, or comprise, for further examples, one or more elements selected from the group consisting of Ti, W, Mo, Al, Ta, Cu, Pt, Ir, La, Ni, and Ru and alloys thereof.

The technology described herein can also be applied to other types of programmable resistance materials, such as devices having metal oxide memory elements using $Ni_xO_y$; $Ti_xO_y$; $Al_xO_y$; $W_xO_y$; $Zn_xO_y$; $Zr_xO_y$; $Cu_xO_y$ (x: 0~1; y: 0~1), CMR (colossal magneto resistance) material like $Pr_xCa_yMnO_3$ (x: 0~1; y: 0~1), polymer materials like TCNQ with doping of Cu, $C_{60}$, Ag etc., and PCBM-TCNQ mixed polymers.

Figure 3:
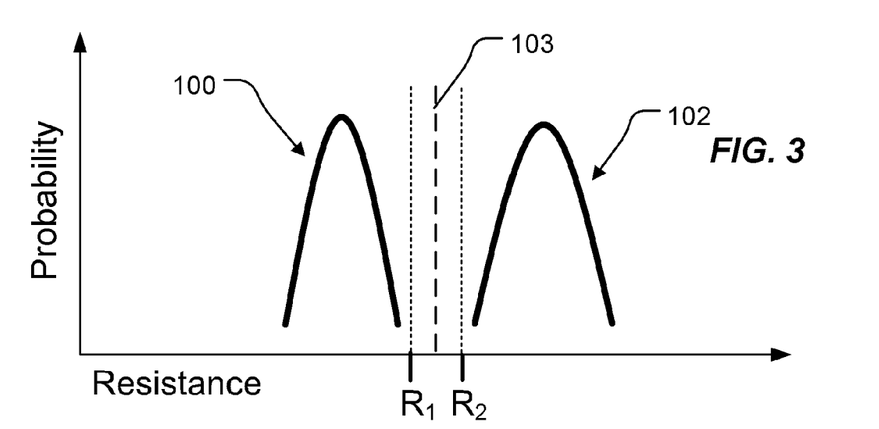
FIG. 3 is a graph showing probability distributions for resistance for high resistance and low resistance states for a programmable resistance memory cell for an ideal case, without margin cells.

FIG. 3 is a heuristic graph showing ideal probability distributions for low resistance state 100 and high resistance state 102 in a programmable resistance memory device, such as that shown in FIG. 2. As shown, the maximum resistance $R_1$ for the distribution for the low resistance state 100 is less than the minimum resistance $R_2$ for the distribution for the high resistance state 102 by a significant margin. A reference level 103 can be used to reliably distinguish between the two states.

Figure 4:
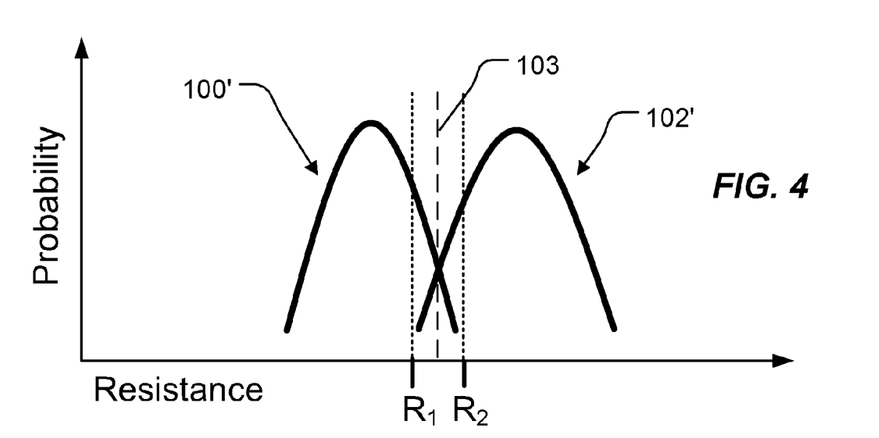
FIG. 4 is a graph showing probability distributions for resistance for high resistance and low resistance states for a programmable resistance memory cell for a case in which margin cells exist.

FIG. 4 is a heuristic graph showing more realistic probability distributions for the low resistance state 100' and high resistance state 102' and a phase change memory cell. As the resistance values drift, a number of cells in the low resistance state 100' will have a resistance greater than $R_1$ and a number of cells in the high resistance state 100' will have a resistance less than $R_2$. When cells in the low resistance state 100' have resistance above the reference level 103, then the data value of the cell is lost. Likewise, when cells in the high resistance state 102' have a resistance below the reference level 103, then the data is lost. It is desirable to detect margin cells that have resistances approaching the reference value, before the data is lost.

Figure 5:
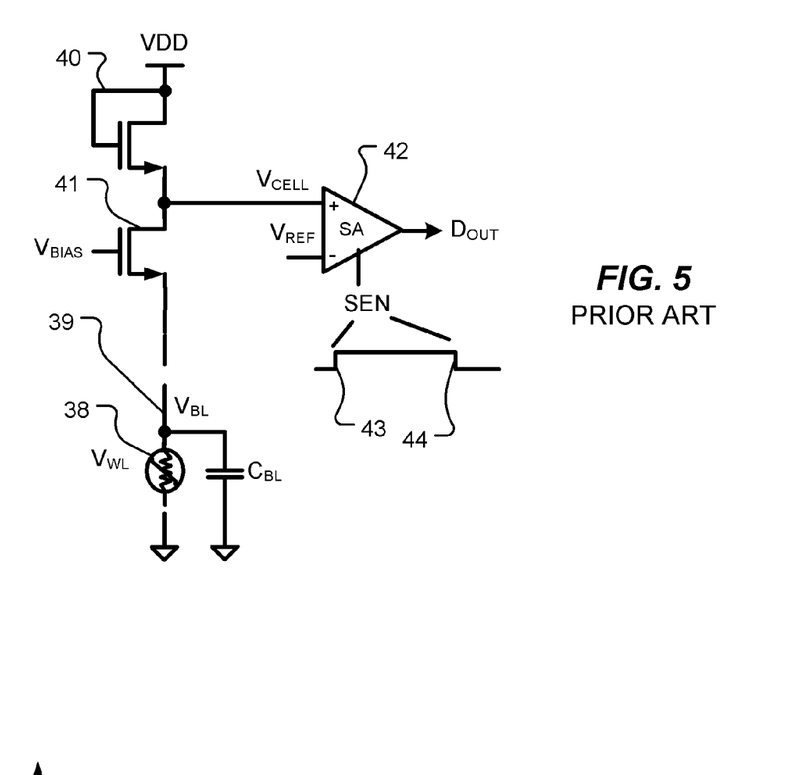
FIG. 5 is a circuit diagram of a prior art sense amplifier circuit, suitable for use in devices as described herein.

FIG. 5 illustrates a basic configuration for a prior art sense amplifier. The embodiment shown in FIG. 5 includes load transistor 40 and clamp transistor 41. A bias voltage VBIAS is produced by a reference voltage circuit, and applied to the gate of the clamp transistor 41. The source of the clamp transistor 41 is coupled to a selected memory cell through decoding circuitry not shown. The bit line capacitance is represented by the capacitor $C_{BL}$. A selected memory cell 38 is coupled to the bit line 39. The sensing node between the load transistor 40 and the clamp transistor 41 is coupled to a sense amplifier 42. A sense enable signal SEN is applied to the sense amplifier 42, to define a sensing interval for a read operation for a selected cell. The sensing interval follows a precharge process in this example. As the voltage $V_{BL}$ on the bit line reaches a level that is about a threshold voltage drop across the clamp transistor 41 below the bias voltage $V_{BIAS}$, the clamp transistor 41 begins to turn off and reduce current flow. The dynamic balance is achieved with the voltage at the sensing node $V_{CELL}$ settles on a target value. At this point, the pre-charge step is completed, and the bit line is ready for sensing. Upon accessing a memory cell, the cell data influences the voltage at the node $V_{CELL}$, causing it to move downward more rapidly if the selected cell has a low resistance state, than if the selected cell has a high resistance state. The reference voltage $V_{REF}$ applied to the sense amplifier 42 is established at a value low enough that current through the selected memory cell during the sensing interval pulls the value at the sensing node $V_{CELL}$ below reference voltage $V_{REF}$ before the end of the sensing interval for memory cells in a low resistance state.

The sensing interval with which the sense amplifier in FIG. 5 operates can be timed in a variety of ways. In representative systems, the signal SEN has a leading edge 43 that is timed relative to detection of a transition of an address input during a read process using address transition detection ADT circuits. The trailing edge 44 of the signal SEN is selected based on the characteristics of the memory array, and defines the length of the sensing interval. The sensing interval must be long enough that the data value in the selected cells can be reliably sensed. Thus, the sensing interval must be long enough for the voltage at the sensing node $V_{CELL}$ to fall below the reference voltage $V_{REF}$ for all memory cells having a resistance within the window for the low resistance state, plus some margin. There is a large variety of sense amplifier designs usable with the present invention, of which the sense amplifier in FIG. 5 is one basic example. There are current mode sense amplifiers, differential sense amplifiers, latching sense amplifiers and so on, all which can be adapted for use with the present invention. Also, a variety of bit line precharge and biasing circuits can be applied as known in the art.

Figure 6:
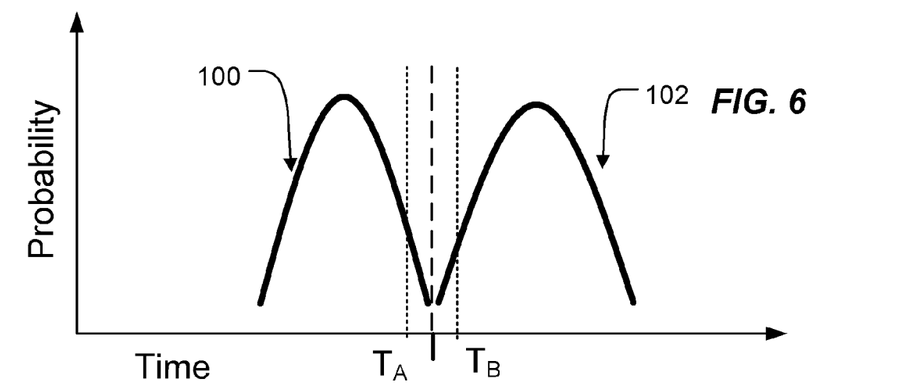
FIG. 6 is a graph showing probability distributions for sensing time for high resistance and low resistance states for a programmable resistance memory cell.

FIG. 6 is a heuristic graph showing probability distributions for sensing time corresponding to the low resistance state 100" and high resistance state 102" for a phase change memory cell. As can be seen by comparison with FIG. 4, the time required for the voltage on the sensing node to reach the reference voltage $V_{REF}$, and trigger a transition in the sense amplifier output correlates with the resistance of the selected memory cell. Using a sense amplifier such that shown in FIG. 5, the time that it takes for the voltage or current on the bit line to fall below the reference voltage and cause a transition in the output of the sense amplifier correlates with the resistance of the cell. Thus, for memory cells in the low resistance state 100", there is a specified maximum time $T_A$ (corresponding with $R_1$ of FIG. 3) within which a sense amplifier transition should occur. For memory cells in the high resistance state 102", there is a specified minimum time $T_B$ (corresponding with $R_2$ of FIG. 3) within which a sense amplifier transition should occur. As described herein, measuring a time that it takes for a sense amplifier transition to occur can be used to detect memory cells operating in the margin between $R_1$ (time $T_A$) and $R_2$ (time $T_B$).

Figure 7:
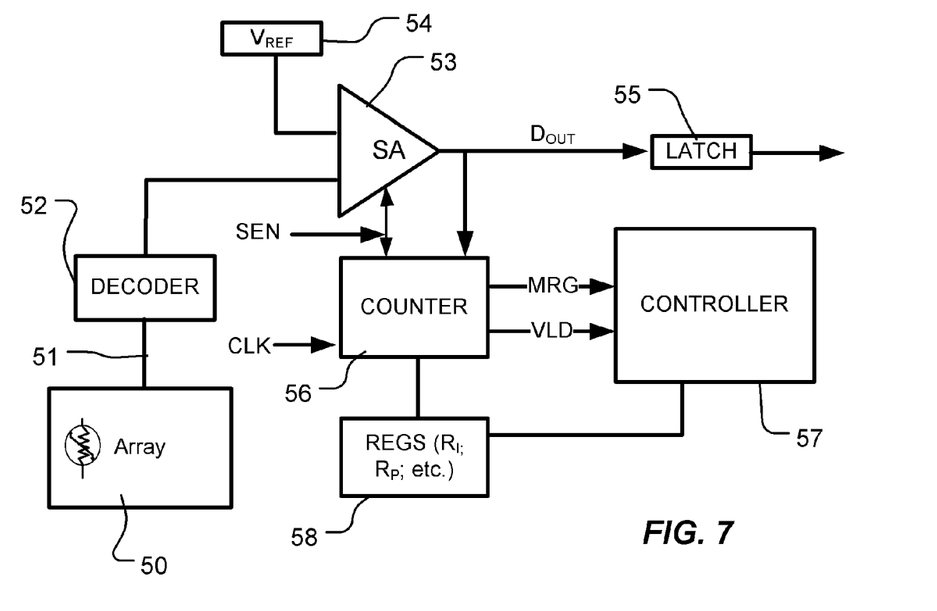
FIG. 7 is a block diagram of a memory device including circuitry for margin cell detection and refresh.

FIG. 7 illustrates circuitry on the integrated circuit, corresponding with the margin cell detection circuitry 125 on the integrated circuit of FIG. 1, which can be used to detect the margin cells, and in addition to determine a data value for them and refresh the data value. In this embodiment, the memory array 50 is coupled by bit line 51 through a decoder 52 to a sense amplifier 53. The reference voltage 54 is also coupled to the sense amplifier 53. A sense enable signal SEN is coupled to the sense amplifier 53, and during a read operation, enables the sense amplifier 53 to provide output data $D_{OUT}$ to a latch 55. In this embodiment, a counter 56 or other timing circuitry is coupled to the sense enable signal SEN and to the output of the sense amplifier 53. A clock is applied to the counter that enables high-speed counting relative to the length of the sensing interval. For example, for a sensing interval that is 50 nanoseconds wide, a counter operating in a range of 100 megahertz to one gigahertz could be provided. The counter begins counting upon the leading edge of the enable signal SEN and stops upon detection of a transition on the output of the sense amplifier 53. The value stored in counter indicates a time interval for sensing the data value in the selected cell, and also indicates a resistance value for the cell. The value stored in the counter can then be decoded and supplied to controller 57, such as the controller 134 of FIG. 1, to indicate valid data VLD or margin cell data MRG. For example, if the counter value, which indicates a measured time interval for the selected cell, exceeds a pre-specified minimum, then the output of the counter indicates a margin cell. For example, valid data for a low resistance state can be specified as causing a transition within the first 30 nanoseconds of the 50 nanosecond long sensing interval. Margin cell data is indicated when the transition occurs within the last 20 nanoseconds of the 50 nanosecond sensing interval. Valid data for a high resistance state can be specified as the case in which no transition is detected in the sensing interval. Also, other types of circuits for measuring the time interval which correlates with resistance of the selected cell can be used, including analog timers such as timers based on integration circuits with sample and hold circuits for results storage. When analog timers are used, the controller 57 may include analog comparators.

The circuitry shown in FIG. 7 also includes register set 58. In the event that the controller 57 detects that a selected memory cell is a margin cell, then it executes a process to determine the data value stored in the selected memory cell, representatives of which are described below with reference to FIGS. 8-10. As part of the processes described below, the register set 58 stores a parameter $R_I$ which represents the initial resistance, such as by storing the output of the counter, detected during the read. Register set 58 is used to store a parameter $R_P$ which represents the measured resistance of the selected cell that was programmed during the processes described below, to a pre-specified state such as the high resistance state or the low resistance state. The parameters $R_I$, $R_P$ are used by the controller 57 to determine a data value for the margin cell for the refresh operation. Other parameters may also be stored in the register set.

Figure 8:
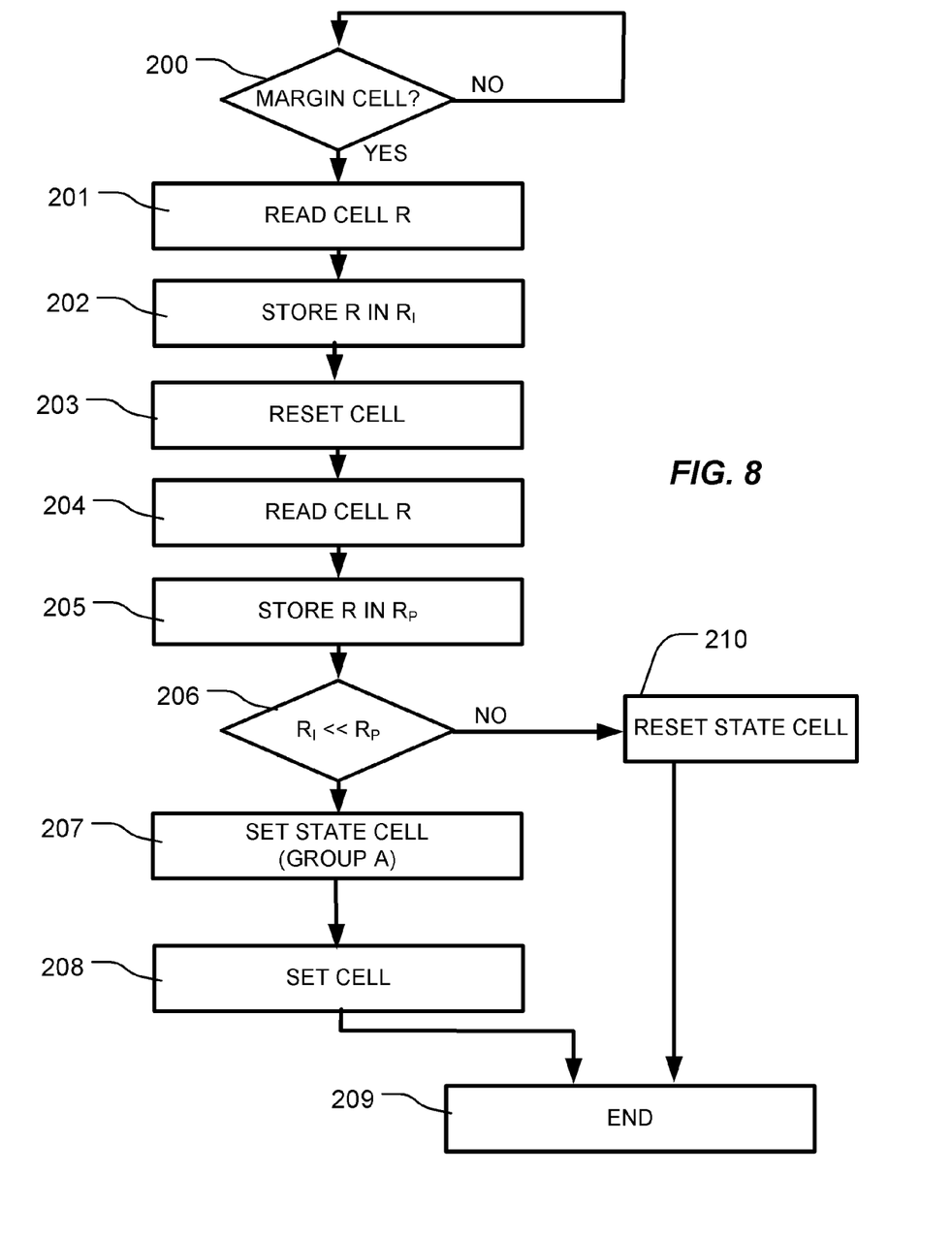
FIG. 8 is a flow chart of a first alternative process for margin cell detection and refresh.

FIG. 8 illustrates a first example process bases on a destructive read of the margin cell, which can be executed by the controller 57 upon detection of a margin cell using circuitry of FIG. 7. The process executed by the controller 57 first determines whether a margin cell is detected (200). If no margin cell is detected, the process loops to wait for such detection. If a margin cell is detected, then the controller causes a process to determine an initial resistance $R_I$ of the selected cell (201), such as by running a second read process, and storing a parameter indicating the resistance, such as output of the counter in the register set 58 (202). Alternatively, the initial read process in which the margin cell is detected can be utilized to supply the parameter $R_I$. Next, the controller 57 causes the process to reset the cell, applying a reset bias arrangement (203). The reset bias arrangement can be a bias arrangement used for resetting the cell in normal write operations. After resetting cell, the cell resistance is again read (204). This process can be executed using a normal reading process, or an alternative reading process in which the sensing interval is extended to allow reading of higher timing values to extend the margin closer to the high resistance state range. The parameter $R_P$ can be a time within the sensing interval, or can saturate at a maximum value indicating no transition detection in the sensing interval. The parameter $R_P$ indicating resistance of the reset cell is stored in the register set 58 (205). Next, the parameters $R_I$ and $R_P$ are compared (206). If $R_I$ is much less than $R_P$, which can be detected by determining whether the difference between the parameters is greater than a pre-specified value, then the data value of the margin cell is determined to be the value corresponding to a set state, or low resistance state (207). In this case, the controller 57 causes a process to set the cell, establishing a refreshed data value in the cell (208). At that point, the refresh process is completed (209) for the set state cell. If at block 206, it is detected that $R_I$ is not much less than $R_P$, then the data value of the margin cell is determined to be the value corresponding to a reset state or high resistance state (210). At that point, the refresh process is completed (209) for the reset state cell.

Figure 9:
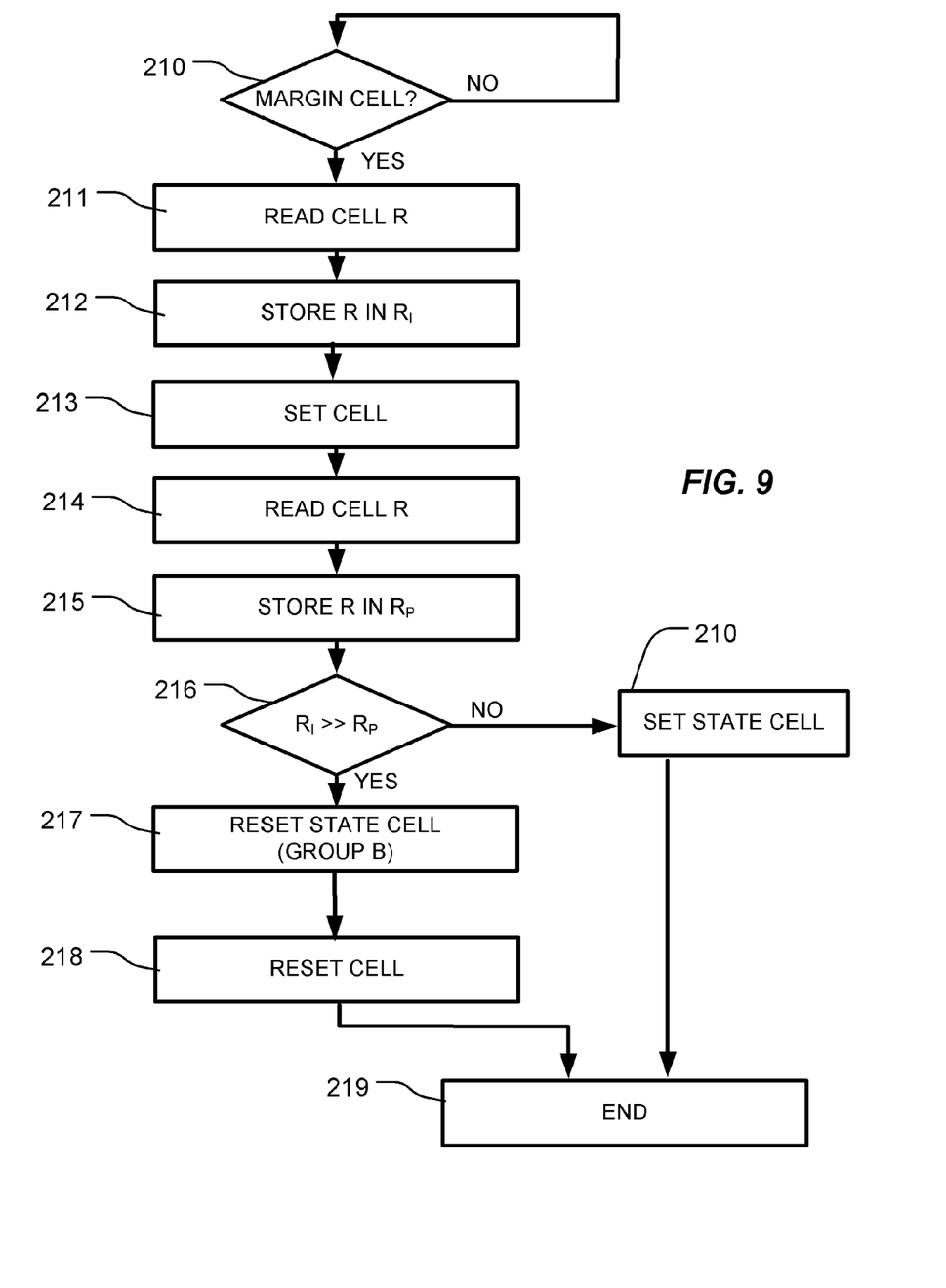
FIG. 9 is a flow chart of a second alternative process for margin cell detection and refresh.

FIG. 9 illustrates a second example process which can be executed by the controller 57 upon detection of a margin cell using a circuitry of FIG. 7, keying on a set process rather than a reset process as used in step 203 of FIG. 8. The process executed by the controller 57 first determines whether a margin cell is detected (210). If no margin cell is detected, the process loops to wait for such detection. If a margin cell is detected, then the controller causes the process to read the resistance $R_I$ of the selected cell (211), such as by running a read process, and storing a parameter indicating the resistance, such as output of the counter in the register set 58 (212). Alternatively, the initial read process in which the margin cell is detected can be utilized to supply the parameter $R_I$. Next, the controller 57 causes a process to set the cell, applying a set bias arrangement (213). The set bias arrangement can be a bias arrangement used for setting the cell in normal operation. After setting cell, the cell resistance is again read (214). This process can be executed using a normal reading process, or an alternative reading process in which the sensing interval is extended to allow reading of higher timing values. The parameter $R_P$ indicating resistance of the set cell is stored in the register set 58 (215). Next, the parameters $R_I$ and $R_P$ are compared (216). If $R_I$ is much greater than $R_P$, which can be detected by determining whether the difference between the parameters is greater than a pre-specified value, then the data value of the margin cell is determined to be the value corresponding to a reset state, or high resistance state (217). In this case, the controller 57 causes the process to reset the cell, establishing a refreshed data value in the cell (218). At that point, the refresh process is completed (219) for the reset state cell. If at block 206, it is detected that $R_I$ is not much greater than $R_P$, then the data value of the margin cell is determined to be the value corresponding to a set state or low resistance state (210). At that point, the refresh process is completed (219) for the set state cell.

Figure 10:
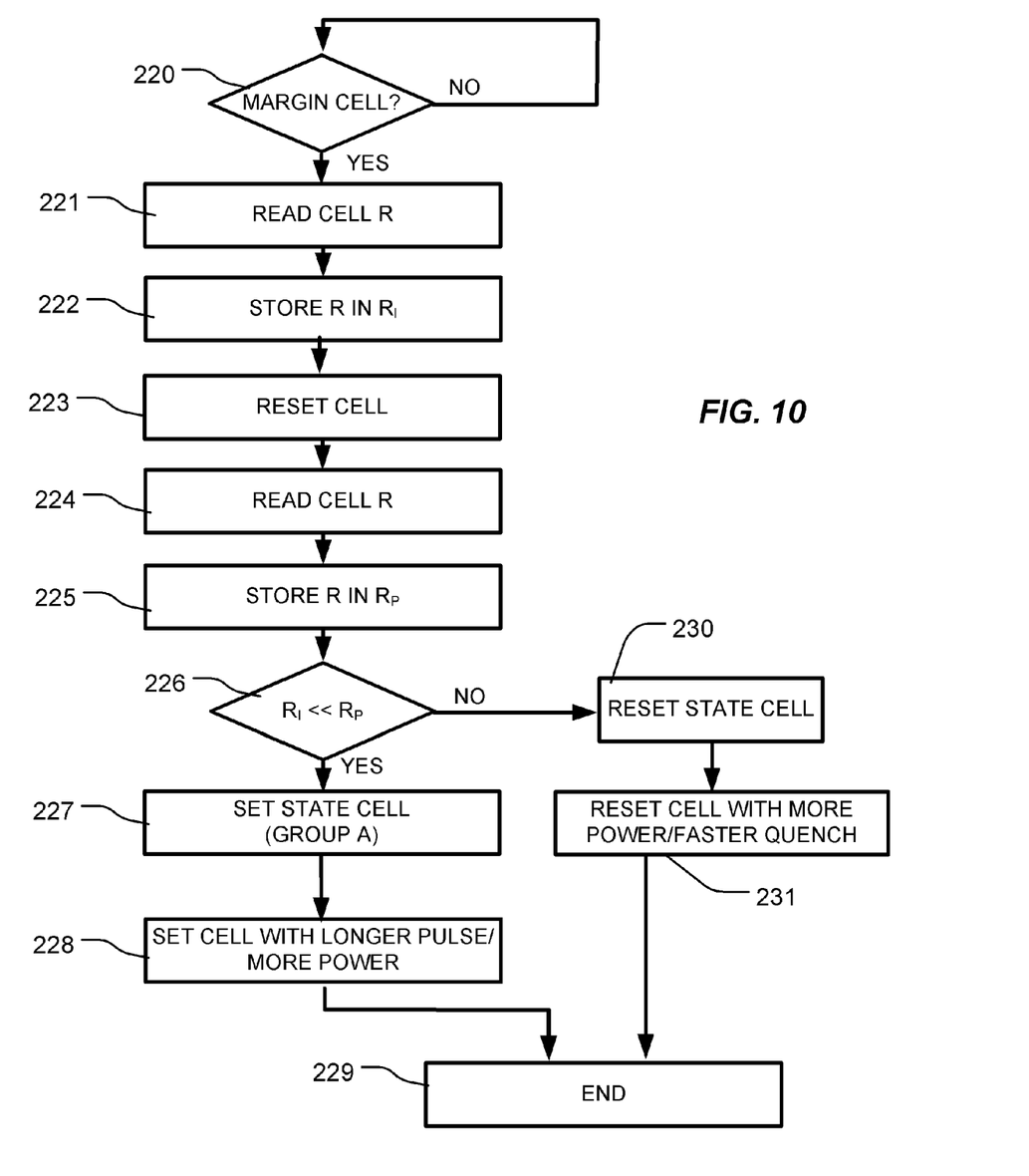
FIG. 10 is a flow chart of a third alternative process for margin cell detection and refresh.

FIG. 10 illustrates a third example process which can be executed by the controller 57 upon detection of a margin cell using the circuitry of FIG. 7, in which the refresh operations use biasing arrangements for both the refresh set process and the refresh reset process which are different than the biasing arrangements used for normal mode set and reset processes. Alternative embodiments may use different biasing arrangements for only one of the set and refresh set pair of operations, and the reset and refresh reset pair of operations. The process executed by the controller 57 first determines whether a margin cell is detected (220). If no margin cell is detected, the process loops to wait for such detection. If a margin cell is detected, then the controller causes the process to read the resistance $R_I$ of the selected cell (221), such as by running a read process, and storing a parameter indicating the resistance, such as output of the counter in the register set 58 (222). Alternatively, the initial read process in which the margin cell is detected can be utilized to supply the parameter $R_I$. Next, the controller 57 causes a process to reset the cell, applying a reset bias arrangement (223). The reset bias arrangement can be a bias arrangement used for resetting the cell in normal write operations. After resetting cell, the cell resistance is again read (224). This process can be executed using a normal reading process, or an alternative reading process in which the sensing interval is extended as explained above. The parameter $R_P$ indicating resistance of the set cell is stored in the register set 58 (225). Next, the parameters $R_I$ and $R_P$ are compared (226). If $R_I$ is much less than $R_P$, which can be detected by determining whether the difference between the parameters is greater than a pre-specified value, then the data value of the margin cell is determined to be the value corresponding to a set state, or low resistance state (227). In this case, the controller 57 causes the process to cause a refresh set for the cell, establishing a refreshed data value in the cell (228). The refresh set process uses a bias arrangement different from that used in normal mode set process, such as by using a longer set pulse or higher power set pulse. At that point, the refresh process is completed (229) for the set state cell. If, at block 206, it is detected that $R_I$ is not much less than $R_P$, then the data value of the margin cell is determined to be the value corresponding to a reset state or high resistance state (230). In this case, the controller 57 causes the process to cause a refresh reset for the cell, establishing a refreshed data value in the cell (231). The refresh reset process uses a bias arrangement different from that used in normal mode reset, such as by using a higher power reset pulse, or a reset pulse with a faster quench. At that point, the refresh process is completed (229) for the reset state cell.

The process of FIG. 10 can be adapted in an alternative to using the set state as the reference state, as is done in step 213 of FIG. 9.

Figure 11:
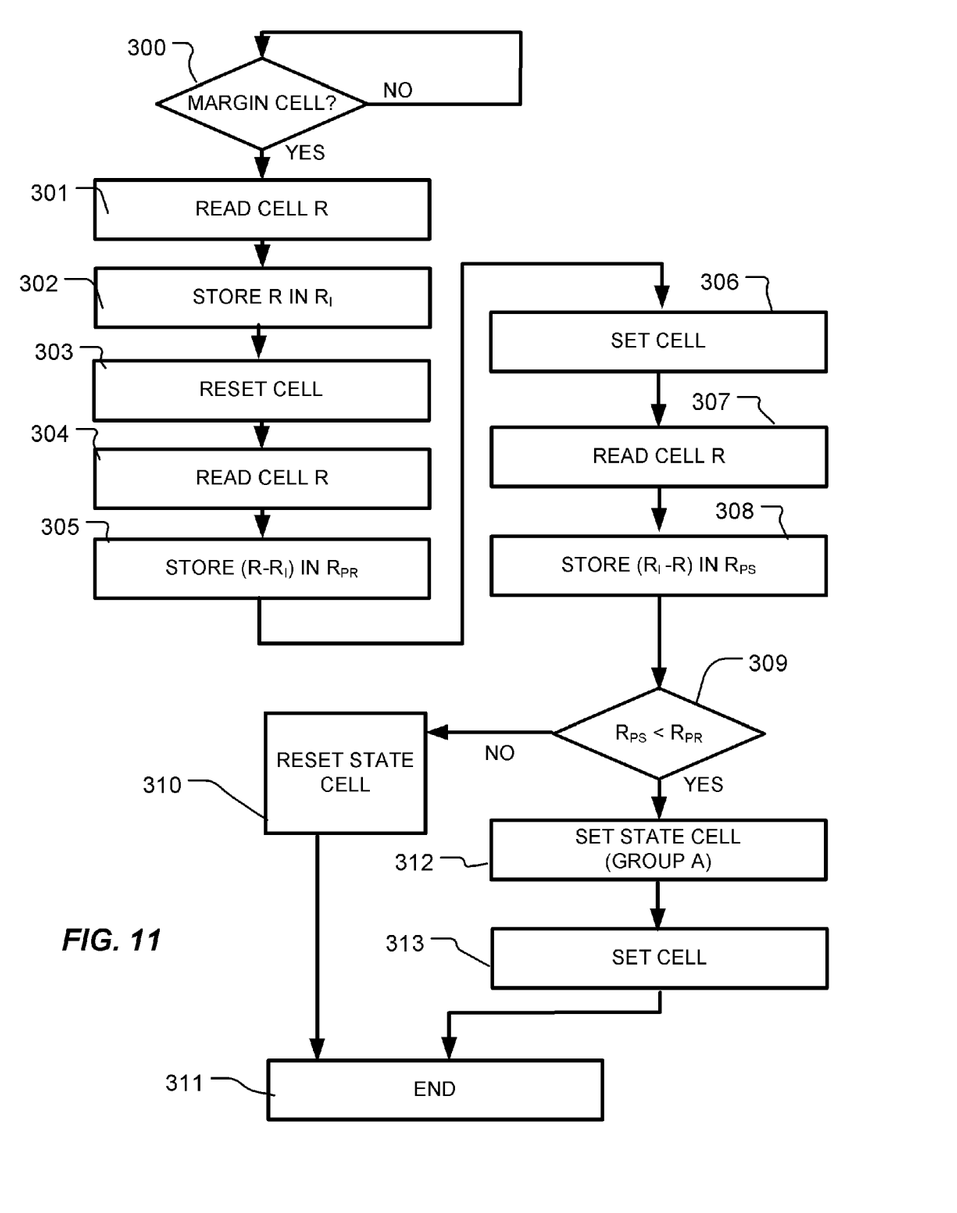
FIG. 11 is a flow chart of a fourth alternative process for margin cell detection and refresh.

FIG. 11 illustrates another example process bases on a destructive read of the margin cell, which can be executed by the controller 57 upon detection of a margin cell using circuitry of FIG. 7. In the process of FIG. 11, the programmable resistance memory cells include phase change memory elements, having a set state corresponding to a first data value and a reset state corresponding to a second data value. Logic executed by the controller to determine the data value stored in the selected cell executes a process including storing an initial resistance of the margin cell, setting the margin cell, measuring a set state resistance of the margin cell, resetting the margin cell, measuring a reset resistance of the margin cell, and indicating that the data value of the margin cell is the first data value if the first resistance is closer to the set state resistance than to the reset state resistance, else that the data value of the selected cell is the second data value. The set and reset steps can be executed in any order. In the illustrated example, the process executed by the controller 57 first determines whether a margin cell is detected (300). If no margin cell is detected, the process loops to wait for such detection. If a margin cell is detected, then the controller causes a process to determine an initial resistance $R_I$ of the selected cell (301), such as by running a second read process, and storing a parameter indicating the resistance, such as output of the counter in the register set 58 (302). Alternatively, the initial read process in which the margin cell is detected can be utilized to supply the parameter $R_I$. Next, the controller 57 causes the process to reset the cell, applying a reset bias arrangement (303). The reset bias arrangement can be a bias arrangement used for resetting the cell in normal write operations. After resetting cell, the cell resistance R is again read (304). This process can be executed using a normal reading process, or an alternative reading process in which the sensing interval is extended to allow reading of higher timing values to extend the margin closer to the high resistance state range. The resistance R can be represented by a time within the sensing interval, or can saturate at a maximum value indicating no transition detection in the sensing interval. The difference between the reset cell resistance R and the initial resistance $R_I$ is stored as a parameter $R_{PR}$ (305). Next, the controller 57 causes a process to set the cell, applying a set bias arrangement (306). The set bias arrangement can be a bias arrangement used for setting the cell in normal operation. After setting cell, the cell resistance R is again read (307). This process can be executed using a normal reading process, or an alternative reading process in which the sensing interval is extended to allow reading of higher timing values. The difference between the initial resistance $R_I$ and the set cell resistance R is stored as a parameter $R_{PS}$ (308).

Next, the controller determines whether $R_{PS}$ is less than $R_{PR}$ (309). If it is determined that $R_{PS}$ is not less than $R_{PR}$, (i.e. the initial resistance was closer to a reset resistance than to a set resistance), then the data value of the margin cell is determined to be the value corresponding to a reset state or high resistance state (310). At that point, the refresh process is completed (311) for the reset state cell. If at block 309, it is determined that $R_{PS}$ is less than $R_{PR}$, (i.e. the initial resistance was closer to a set resistance than to a reset resistance) then the data value of the margin cell is determined to be the value corresponding to a set state, or low resistance state (312). In this case, the controller 57 causes a process to set the cell, establishing a refreshed data value in the cell (313). At that point, the refresh process is completed (311) for the set state cell.

In the case that $R_{PS}$ is equal to $R_{PR}$, the system can issue an error signal, enabling the system to take corrective action, or can make a determination that the margin cell should be in one of the set and reset states, as suits the needs of the system. Also, as with the process of FIG. 10, after determining the expected state of the margin cell, then refresh set and refresh reset bias arrangements can be used to improve the likelihood that the margin cell will be successfully programmed, as explained above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an array of programmable resistance memory cells;
a sense amplifier coupled to the array, which senses changes of voltage or current on bit lines coupled to a selected memory cell;
timer circuitry coupled to the array, which measures a time interval which correlates with resistance of the selected cell; and
logic responsive to the time interval for the selected cell, to enable refresh logic if the time interval has a duration that falls within a pre-specified range;
said refresh logic including logic to determine a data value stored in the selected cell, and to refresh the data value in the selected cell, wherein said logic to determine a data value stored in the selected cell executes a process including storing a first parameter indicating length of the time interval for the selected cell, writing a reference data value to the selected cell, measuring a second time interval which correlates with resistance of the selected cell after said writing, storing a second parameter indicating length of the second time interval, and comparing the first parameter to the second parameter.

2. The device of claim 1, wherein the programmable resistance memory cells include phase change memory elements, having a set state corresponding to a first data value and a reset state corresponding to a second data value, and wherein said reference data value is the first data value, and including the step of indicating the data value of the selected cell is the second data value if the first parameter is greater than the second parameter by more than a predetermined amount, else the data value of the selected cell is the first data value.

3. The device of claim 2, including if the data value of the selected cell is indicated to be the second data value, then writing the second data value to the selected cell.

4. The device of claim 1, wherein the programmable resistance memory cells include phase change memory elements, having a set state corresponding to a first data value and a reset state corresponding to a second data value, and wherein said reference data value is the second data value, and including the step of indicating the data value of the selected cell is the first data value if the first parameter is less than the second parameter by more than a predetermined amount.

5. The device of claim 4, including if the data value of the selected cell is indicated to be the first data value, then writing the first data value to the selected cell.

6. A memory device, comprising:
an array of programmable resistance memory cells;
a sense amplifier coupled to the array, which senses changes of voltage or current on bit lines coupled to a selected memory cell;
timer circuitry coupled to the array, which measures a time interval which correlates with resistance of the selected cell; and
logic responsive to the time interval for the selected cell, to enable refresh logic if the time interval has a duration that falls within a pre-specified range;
said refresh logic including logic to determine a data value stored in the selected cell, and to refresh the data value in the selected cell, wherein the programmable resistance memory cells include phase change memory elements, having a set state corresponding to a first data value and a reset state corresponding to a second data value, and wherein said logic to determine the data value stored in the selected cell executes a process including storing a first resistance of the selected cell, setting the selected cell to the set state, measuring a set state resistance, resetting the selected cell to the reset state, measuring a reset state resistance, and indicating that the data value of the selected cell is the first data value if the first resistance is closer to the set state resistance than to the reset state resistance, else that the data value of the selected cell is the second data value.

7. A method for operating a memory device including an array of programmable resistance memory cells, and a sense amplifier coupled to the array which senses changes of voltage or current on a bit line coupled to a selected memory cell; the method comprising:
reading the selected cell;
measuring a time interval which correlates with resistance of the selected cell during said reading; and
enabling a refresh process if the time interval has a duration that falls within a pre-specified range;
said refresh process including determining a data value stored in the selected cell, and refreshing the data value in the selected cell, wherein said determining a data value stored in the selected cell includes storing a first parameter indicating length of the time interval for the selected cell, writing a reference data value to the selected cell, measuring a second time interval which correlates with resistance of the selected cell after said writing, storing a second parameter indicating length of the second time interval, and comparing the first parameter to the second parameter.

8. The method of claim 7, wherein the programmable resistance memory cells include phase change memory elements, having a set state corresponding to a first data value and a reset state corresponding to a second data value, and wherein said reference data value is the first data value, and including the step of indicating the data value of the selected cell is the second data value if the first parameter is greater than the second parameter by more than a predetermined amount, else the data value of the selected cell is the first data value.

9. The method of claim 8, including if the data value of the selected cell is indicated to be the second data value, then writing the second data value to the selected cell.

10. The method of claim 7, wherein the programmable resistance memory cells include phase change memory elements, having a set state corresponding to a first data value and a reset state corresponding to a second data value, and wherein said reference data value is the second data value, and including the step of indicating the data value of the selected cell is the first data value if the first parameter is less than the second parameter by more than a predetermined amount.

11. The method of claim 10, including if the data value of the selected cell is indicated to be the first data value, then writing the first data value to the selected cell.

12. A method for operating a memory device including an array of programmable resistance memory cells, and a sense amplifier coupled to the array which senses changes of voltage or current on a bit line coupled to a selected memory cell; the method comprising:
reading the selected cell;
measuring a time interval which correlates with resistance of the selected cell during said reading; and
enabling a refresh process if the time interval has a duration that falls within a pre-specified range;
said refresh process including determining a data value stored in the selected cell, and refreshing the data value in the selected cell, wherein the programmable resistance memory cells include phase change memory elements, having a set state corresponding to a first data value and a reset state corresponding to a second data value, and wherein said determining the data value stored in the selected cell includes storing a first resistance of the selected cell, setting the selected cell to the set state, measuring a set state resistance, resetting the selected cell to the reset state, measuring a reset state resistance, and indicating that the data value of the selected cell is the first data value if the first resistance is closer to the set state resistance than to the reset state resistance, else that the data value of the selected cell is the second data value.

* * * * *